United States Patent
Wutte

(10) Patent No.: US 9,634,137 B2
(45) Date of Patent: Apr. 25, 2017

(54) INTEGRATED POWER TRANSISTOR CIRCUIT HAVING A CURRENT-MEASURING CELL

(71) Applicant: Infineon Technologies Austria AG, Villach (AT)

(72) Inventor: Britta Wutte, Feistritz (AT)

(73) Assignee: Infineon Technologies Austria AG, Villach (AT)

( * ) Notice: Subject to any disclaimer, the term of this patent is extended or adjusted under 35 U.S.C. 154(b) by 18 days.

(21) Appl. No.: 13/848,767

(22) Filed: Mar. 22, 2013

(65) Prior Publication Data

US 2013/0248861 A1    Sep. 26, 2013

(30) Foreign Application Priority Data

Mar. 23, 2012 (DE) .................. 10 2012 102 533

(51) Int. Cl.
*H01L 29/78* (2006.01)
*H01L 29/66* (2006.01)
(Continued)

(52) U.S. Cl.
CPC .... *H01L 29/7815* (2013.01); *H01L 29/41741* (2013.01); *H01L 29/66734* (2013.01);
(Continued)

(58) Field of Classification Search
CPC ............. H01L 29/66734; H01L 29/772; H01L 21/283; H01L 29/7815; H01L 29/41;
(Continued)

(56) References Cited

U.S. PATENT DOCUMENTS 6,734,561 B2 * 5/2004 Kawai ........................ 257/758
8,928,066 B2 * 1/2015 Wutte .................. H01L 29/407
257/328

(Continued)

FOREIGN PATENT DOCUMENTS

CN    101996957 A    3/2011

OTHER PUBLICATIONS

EPO patent family search results.*

*Primary Examiner* — Dale E Page
*Assistant Examiner* — Vincent Wall
(74) *Attorney, Agent, or Firm* — Murphy, Bilak & Homiller, PLLC

(57) ABSTRACT

An integrated power transistor circuit includes a contact structure with a first section and a second section. The first section contacts doped regions of transistor cells in a cell array. The second section includes one or more first subsections which adjoin the first section and extend beyond the cell array in the region of selected transistor cells. A second subsection adjoins the one or more first subsections and forms a tapping line, for example for making contact with source regions of power transistor cells. In the region of the cell array, an electrode structure rests on the contact structure. This electrode structure is absent over the second section. The tapping line can thus be formed at a short distance from the electrode structure, with the result that the active chip area is only insubstantially reduced by the tapping line.

14 Claims, 9 Drawing Sheets

(51) Int. Cl.
*H01L 29/417* (2006.01)
*H01L 29/40* (2006.01)
*H01L 23/00* (2006.01)

(52) U.S. Cl.
CPC .......... *H01L 29/7813* (2013.01); *H01L 24/32* (2013.01); *H01L 24/48* (2013.01); *H01L 24/73* (2013.01); *H01L 29/407* (2013.01); *H01L 29/41766* (2013.01); *H01L 2224/32225* (2013.01); *H01L 2224/48091* (2013.01); *H01L 2224/48227* (2013.01); *H01L 2224/73265* (2013.01); *H01L 2924/00014* (2013.01); *H01L 2924/1306* (2013.01)

(58) Field of Classification Search
CPC .......... H01L 29/7813; H01L 29/41741; H01L 2924/1306; H01L 2924/00014; H01L 24/73; H01L 24/48; H01L 24/32; H01L 29/41766; H01L 2224/32225; H01L 2224/48091; H01L 2224/48227; H01L 2224/73265; H01L 29/407

USPC ......... 257/60, 135, 220, 263, 302, 329–334, 257/E21.118, E29.183, 48, 270; 438/270
See application file for complete search history.

(56) References Cited

U.S. PATENT DOCUMENTS

| | | |
|---|---|---|
| 2002/0192935 A1 | 12/2002 | Joshi et al. |
| 2007/0040215 A1* | 2/2007 | Ma .................... H01L 29/0696 257/330 |
| 2008/0001221 A1* | 1/2008 | Yoshimura .......... H01L 29/0696 257/331 |
| 2009/0206913 A1* | 8/2009 | Zeng .................. H01L 29/0615 327/534 |
| 2010/0187640 A1 | 7/2010 | Miyata et al. |
| 2011/0037126 A1* | 2/2011 | Kadow et al. ................. 257/368 |
| 2011/0042741 A1 | 2/2011 | Fukuoka et al. |
| 2011/0215399 A1* | 9/2011 | Matsuura et al. ............ 257/331 |
| 2014/0217495 A1* | 8/2014 | Wutte .................. H01L 29/407 257/328 |

* cited by examiner

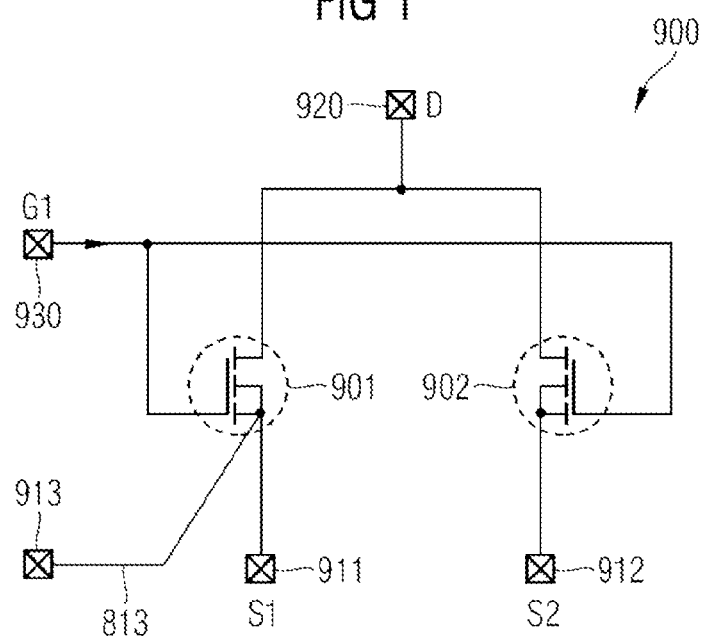
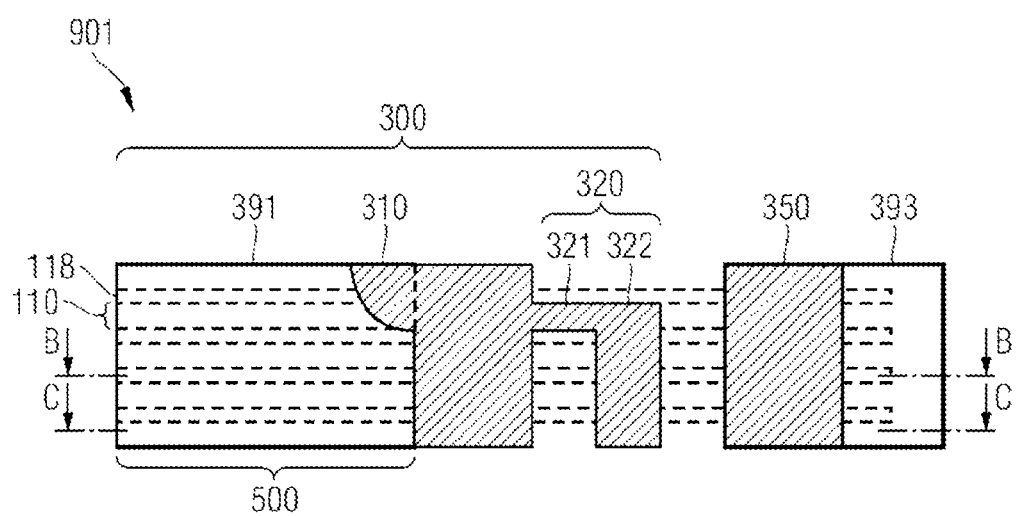

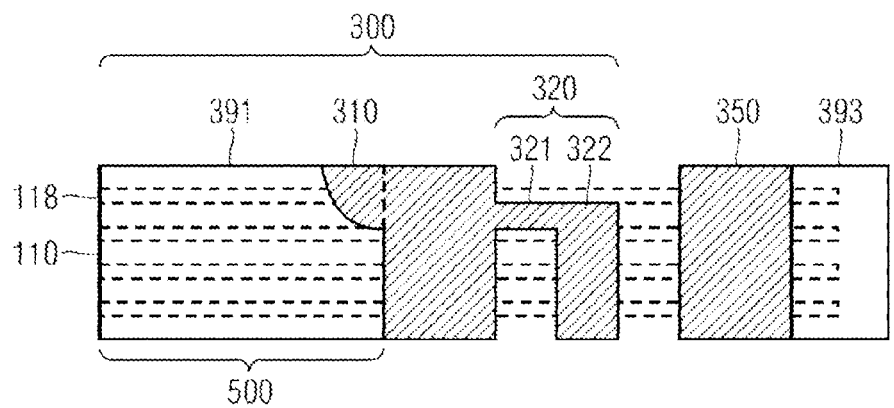
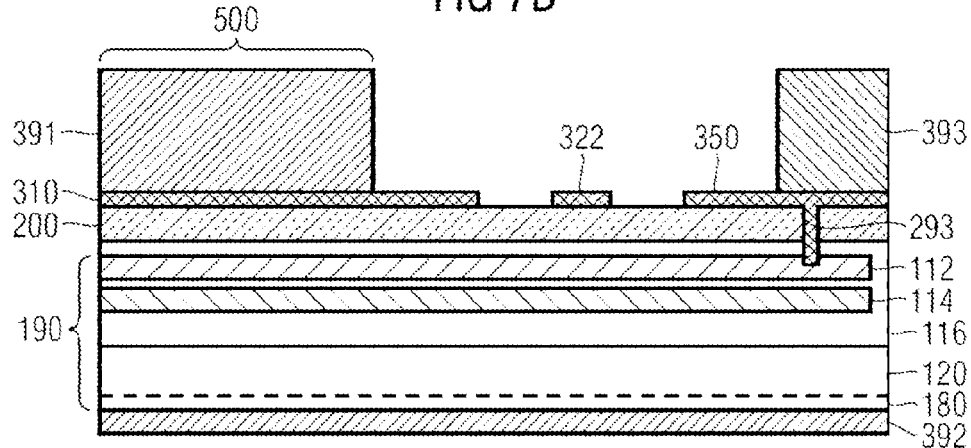
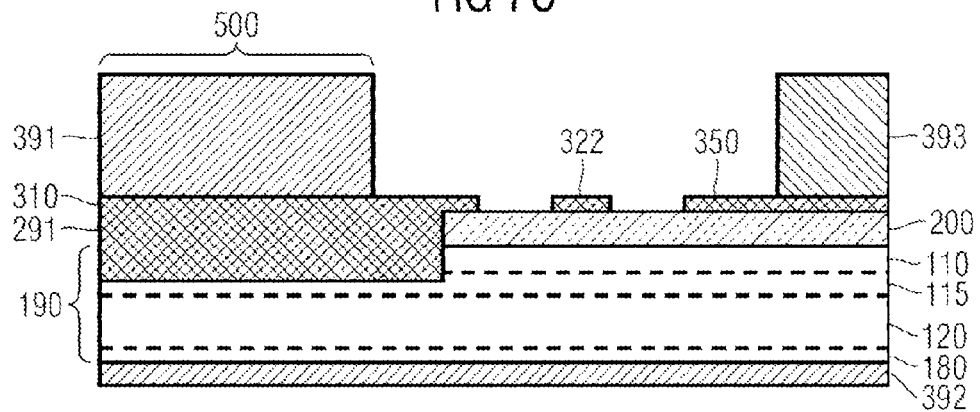

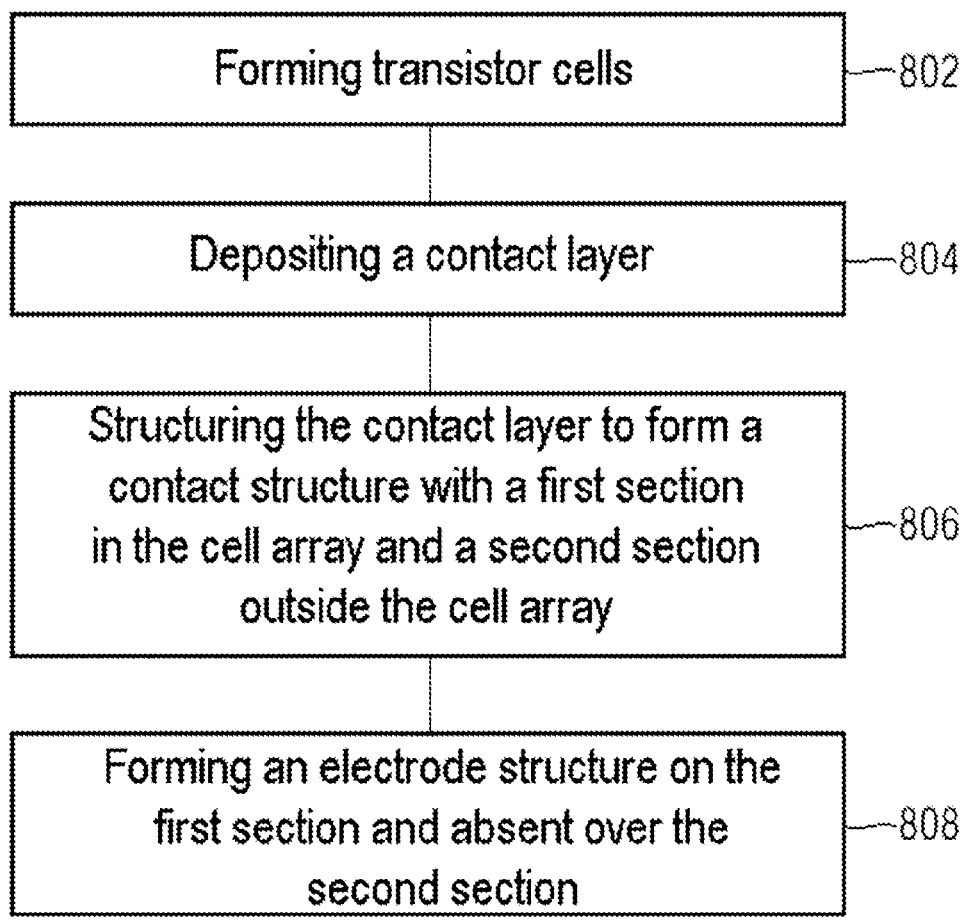

INTEGRATED POWER TRANSISTOR CIRCUIT HAVING A CURRENT-MEASURING CELL

PRIORITY CLAIM

This application claims priority to German Patent Application No. 10 2012 102 533.9, filed on 23 Mar. 2012, the content of said German application incorporated herein by reference in its entirety.

TECHNICAL FIELD

The application relates to an integrated power transistor circuit and to a method for producing the same.

BACKGROUND

Integrated power transistor circuits comprise a multiplicity of transistor cells and are often provided with current-measuring cells, which enable the measurement of the load current. In general, for this purpose, one of the transistor cells is selected as a current-measuring cell (sense transistor cell) and operated substantially in parallel with the other transistor cells i.e. the power transistor cells. While the drain electrodes and gate electrodes of the current-measuring cell and the power transistor cells are each driven jointly, the potentials at the source electrodes of the current-measuring cell and the power transistor cells are detected separately. The load current flowing through the power transistor cells can be estimated from the difference between the source potentials of the current-measuring cell and the power transistor cells.

It is desirable to measure the source potential of the power transistor cells as accurately as possible without losing active chip area for the transistor cells and the electrodes thereof.

SUMMARY

One embodiment relates to an integrated power transistor circuit with a transistor cell, which is arranged in a cell array and has a doped region. The doped region is formed in a semiconductor substrate and adjoins a first surface of the semiconductor substrate on a first side of the semiconductor substrate. In addition, in a projection of the cell array orthogonal to the first surface, an electrode structure is formed on the first side. A contact structure is electrically conductively connected to the doped region and the electrode structure. A first section of the contact structure is formed in the cell array between the electrode structure and the semiconductor substrate. A second section of the contact structure outside the cell array connects the first section to an interface structure.

Another embodiment relates to an integrated power transistor circuit with one or more transistor cells which are formed in a cell array. Each transistor cell has a doped region formed in a semiconductor substrate and adjoining a first surface on a first side of the semiconductor substrate. A contact structure is provided on the first side of the semiconductor substrate and electrically conductively connected to the doped regions. The contact structure, in a projection of the cell array orthogonal to the first surface, has a first section and a second section which connects the first section to an interface structure. An electrode structure is formed over the first section. This electrode structure is absent over the second section.

Another embodiment relates to a method for producing an integrated circuit unit. At least one transistor cell is formed in a cell array. Each transistor cell has a doped region formed in a semiconductor substrate and adjoining a first surface of the semiconductor substrate on a first side of the semiconductor substrate. On the first side, a contact layer is deposited and structured. A contact structure is formed from the contact layer. The contact structure has, in a projection of the cell array orthogonal to the first surface, a first section and, outside the cell array, a second section. The second section connects the first section to an interface structure. In an orthogonal projection of the cell array, an electrode structure is formed on and in direct contact with the first section. The electrode structure is absent outside the cell array.

Those skilled in the art will recognize additional features and advantages upon reading the following detailed description, and upon viewing the accompanying drawings.

BRIEF DESCRIPTION OF THE DRAWINGS

The attached figures enable further understanding of the embodiments of the invention and form a part of this description. The figures illustrate the embodiments and, together with the description, serve to explain the considerations on which the invention is based. Further embodiments of the invention and some of the advantages achieved result directly with reference to the following detailed description. The elements of the figures are not necessarily represented true to scale with respect to one another. Identical reference symbols relate to mutually corresponding elements and structures.

FIG. 1 shows a simplified circuit diagram of an integrated power transistor circuit in accordance with one embodiment.

FIG. 2A shows a schematic plan view of a section of an integrated power transistor circuit with a cell array in accordance with one embodiment, in which a contact structure has a section running parallel to the edge of an electrode structure.

FIG. 7A shows the section of the integrated power transistor circuit shown in FIG. 6A after the formation of electrode structures.

FIG. 7B shows a schematic cross section through the section shown in FIG. 7A along gate trenches.

FIG. 7C shows a schematic cross section through the section shown in FIG. 7A along emitter regions.

FIG. 8 is a simplified flowchart for illustrating a method for producing an integrated power transistor circuit in accordance with a further embodiment.

DETAILED DESCRIPTION

Figure 2B:
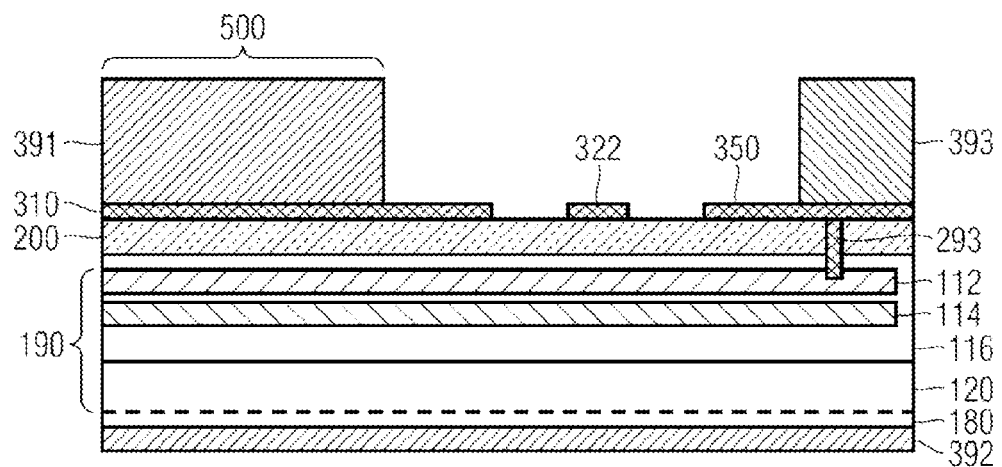
FIG. 2B shows a schematic cross section through the section of the integrated power transistor circuit shown in FIG. 2A along gate trenches (along the line B-B in FIG. 2A).

Exemplary embodiments will be explained in more detail below with reference to the figures. However, the invention is not restricted to the specifically described embodiments, but can be modified and adapted in a suitable manner. Individual features and combinations of features of an embodiment can be combined suitably with features and combinations of features of another embodiment, if this is not ruled out.

Before the exemplary embodiments are explained in more detail with reference to the figures below, reference is made to the fact that mutually corresponding elements in the figures have been provided with corresponding or similar reference symbols and no repeated description of these elements has been provided. In addition, the figures are not necessarily illustrated true to scale since the focus of the figures is that of illustrating and explaining principles.

FIG. 1 shows the simplified circuit diagram of an integrated power transistor circuit 900 with a current measurement function. A plurality of transistor cells connected in parallel form a power transistor 901. At least one further transistor cell forms a sense transistor 902. The power transistor 901 and the sense transistor 902 are field effect transistors. In the case of field effect transistors, the potential applied to a gate electrode controls a current flow in a load path between a drain region and a source region by virtue of an electrical field associated with the gate electrode controlling the charge carrier distribution in a channel region between the drain and source regions. The drain regions of the power transistor 901 and of the sense transistor 902 are connected to one another and routed to a drain connection (D) 920, for example. The gate electrodes of the power transistor 901 and of the sense transistor 902 are connected to one another. In accordance with the embodiment shown in FIG. 1, the two gate electrodes are routed to a common gate connection (G1) 930.

The source regions of the power transistor 901 are routed to a source connection (S1) 911. The source region of the sense transistor 902 is routed, isolated from source connection 911, to a sense source connection (S2) 912. The drain connection 920, the gate connection 930, the source connection 911 and the sense source connection 912 can each be in the form of contact pads. The transistor cell for the sense transistor 902 is identically designed to the transistor cells for the power transistor 901. In general, the integrated power transistor circuit 900 comprises identical transistor cells, which are arranged in a plurality of cell arrays, wherein at least one transistor cell of a centrally arranged cell array is wired as a sensor cell.

In order to measure the load current, a voltage difference between a mid-potential of the source regions of the power transistor 901 and the potential at the source region of the sense transistor 902 is evaluated. The load current is estimated based on the potential difference. If the estimated load current exceeds a predefined threshold value, control electronics can control the potential at the gate electrodes, via the gate connection 930, in such a way that the load current is limited or downwardly adjusted.

In order to measure the source potential of the power transistor 901, the potential of the source regions of selected transistor cells is tapped off and routed via a tapping line 813 to a tapping connection 913, which can likewise be in the form of a contact pad.

The connections between the source regions of the power transistor 901 and the source connection 911 are at least two-layered, wherein a first, thin layer consisting of a first material makes direct contact with the source regions and a second, thicker layer consisting of a second material forms a sufficiently low-resistance connection between the source regions and the source connection 911. On the other hand, in the embodiments described below, the tapping line 813 comprises only the first layer between selected source regions of the power transistor 901 and the tapping connection 913, while the second layer is absent.

Figure 2C:
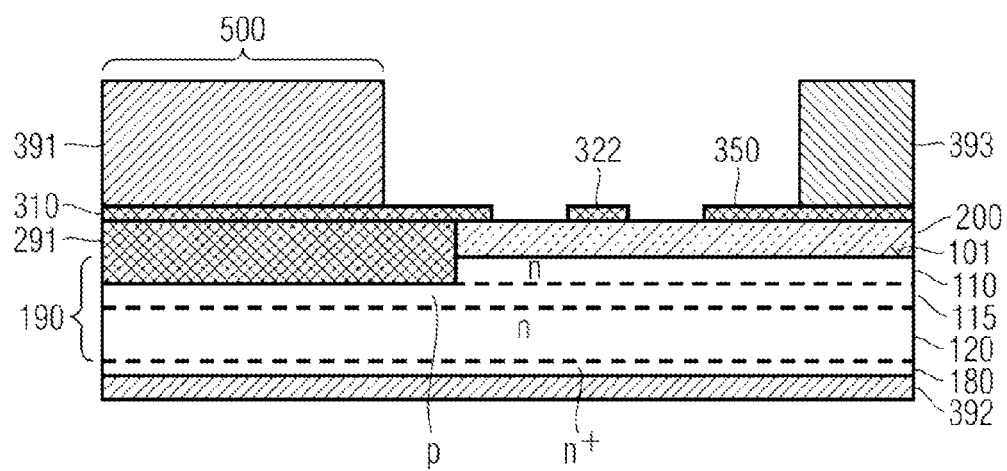
FIG. 2C shows a schematic cross section through the section of the integrated power transistor circuit shown in FIG. 2A along emitter regions (along the line C-C in FIG. 2A).

FIGS. 2A, 2B and 2C show a section of an integrated power transistor circuit having a plurality of transistor cells of a power transistor 901 in plan view and in two parallel cross sections. Each transistor cell has a doped region 110, which is formed in a semiconductor substrate 190 and adjoins a first surface 101 of the semiconductor substrate 190 on a first side of the semiconductor substrate 190, as can be seen from FIG. 2C. The material of the semiconductor substrate 190 is monocrystalline silicon, for example. The semiconductor substrate 190 can comprise one or more epitaxially grown layers with different dopants and different dopant concentrations and dopant concentration profiles. In accordance with one embodiment, the semiconductor substrate 190 comprises, in addition to the doped regions 110 effective as source regions, a further doped region 180 on the second side of the semiconductor substrate 190, the second side being opposite the first side, and a drift layer 120 adjoining the further doped region 180. A channel region 115 is formed at least within a cell array 500 between the doped regions 110 and the drift layer 120, the conductivity type of the channel region 115 being opposite to that of the doped region 110, the further doped region 180 and the drift layer 120. For example, the doped region 110, the further doped region 180, and the drift zone 120 are of the n conduction type, while the channel region 115 is of the p conduction type. The doped regions 110 and the channel region 115 are formed at least in the region of the transistor cells in the cell array 500 and can be absent outside the cell array 500.

In addition, the transistor cells comprise gate conductor structures 112. The gate conductor structures 112 can be arranged in gate trenches 118, which, starting from the first surface 101, extend into the semiconductor substrate 190, wherein the doped regions 110 are arranged between the gate trenches 118. The gate trenches 118 are strip shaped and extend along a first direction. The gate conductor structures 112 are electrically insulated from the surrounding semiconductor substrate 190 by dielectric structures 116. The dielectric structures 116 each form a gate dielectric between the gate conductor structures 112 and the channel regions 115. A potential applied to the gate conductor structures 112 controls a current flow between the doped regions 110 and the further doped region 180. In addition to the gate conductor structures 112, a field electrode 114 or another structure insulated from the gate conductor structures 112 can be formed in the gate trenches 118. The field electrode 114 can be provided below the gate conductor structures 112 in relation to the first surface 101, for example. The field electrode 114 is electrically insulated from the gate conductor structures 112 and the surrounding semiconductor substrate 190 by the dielectric structure 116.

A dielectric layer 200 rests on the first surface 101. The dielectric layer 200 can comprise one, two or more layers consisting of different materials. For example, the dielectric layer 200 comprises a layer consisting of silicon oxide, silicon nitride or BPSG (borophosphosilicate glass).

In addition, a contact structure 300 is formed on the first side of the semiconductor substrate 190 and is electrically conductively connected to the doped regions 110 of the transistor cells. In the region of the cell array 500, the contact structure 300 has a first section 310. A second section 320 of the contact structure 300 is formed outside the cell array 500 and connects the first section 310 to an interface structure outside the illustrated region. The interface structure is, for example, a contact pad for making external contact with or making a transition to a logic region of the integrated power transistor circuit. The integrated power transistor circuit also has an electrode structure 391, which is formed directly on at least part of the first section 310 of the contact structure 300 and is absent over the second section 320.

In accordance with one embodiment, the second section 320 of the contact structure 300 has one or more first subsections 321, which each extend, in the region of selected transistor cells, starting from the first section 310, in the first direction beyond the cell array 500 and which are absent in the region of transistor cells which are not selected for measurement. A second subsection 322 adjoins the one or the plurality of first subsections 321 and extends along a second direction, which intersects the first direction. In accordance with one embodiment, the second subsection 322 runs perpendicular to the gate trenches 118. The second subsection 322 forms a section of the tapping line 813 in FIG. 1A. The tapping line is physically spaced apart from the unselected transistor cells by insulated material.

In accordance with one embodiment, the doped regions 110 are source regions of the transistor cells and the electrode structure 391 is a source electrode of the integrated power transistor circuit. In accordance with the embodiment shown in FIG. 2A, the second subsection 322 of the contact structure 300 (the tapping line) extends parallel to an edge of the electrode structure 391.

In accordance with one embodiment, the integrated power transistor circuit additionally comprises a gate electrode 393, which is arranged on the first side of the semiconductor substrate 190 and is electrically connected to the gate conductor structures 112. In accordance with one embodiment, the second subsection 322 of the contact structure 320 (the tapping line) extends parallel to an edge of the gate electrode 393. The second subsection 322 of the contact structure 300 can be routed between an edge of the electrode structure 391 and an edge, parallel to this, of the gate electrode 393.

One or more first plated-through holes 293 extend through the dielectric layer 200 arranged between the semiconductor substrate 190 and the contact structure 300. Each first plated-through hole 293 connects the gate electrode 393 to the gate conductor structures 112. In accordance with one embodiment, the first plated-through holes 293 and the contact structure 300 are formed from the same material or from the same materials. Second plated-through holes 291 extend through the dielectric layer 200 and connect the contact structure 300 to the doped regions 110 and the channel region 115 in the cell array 500. The second plated-through holes 291 and the contact structure 300 are formed from the same material or from the same materials in accordance with a further embodiment.

In accordance with one embodiment, the contact structure 300 and the first and second plated-through holes 293, 291 comprise a tungsten layer. The tungsten layer can have one or more barrier or auxiliary layers, for example consisting of titanium and titanium nitride, underneath.

A drain electrode 392 can be provided adjacent to the second surface of the semiconductor substrate 190, the second surface being opposite the first surface 101. The material of the source electrode 391, the drain electrode 392 and the gate electrode 393 is in each case aluminum Al, copper Cu or an alloy of aluminum and copper AlCu with or without further admixtures and intermediate layers.

The thickness of the contact structure 300 is at most approximately 300 nanometers, for example at most 100 nm. The thickness of the electrode structure 391 and the gate electrode 393 is at least one micrometer.

Since the contact structure 300 comes from a comparatively thin layer, the second subsection 322 and therefore the tapping line for the tapping of the potentials of one or more source regions for determining the load current can be realized with a short distance from the adjacent source electrode 391 or gate electrode 393. If, on the other hand, the tapping line has a conventional realization in terms of the type of electrode structure 391, 393, distances between such a conventional tapping line and the adjacent source electrode 391 or the adjacent gate electrode 393 which are greater by a multiple need to be provided owing to the requirements of the etching process in respect of the layout, resulting in significant losses of active chip area. If the contact structure 300 comes from a layer which is deposited on the dielectric layer 200 during the course of the formation of the first and second plated-through holes 293, 291 and for connecting the plated-through holes 293, 291, the provision of the tapping line does not require any additional process steps. Since the source potential of the power transistor cells is tapped off directly at the source regions of selected power transistor cells, the measurement of the source potential is not falsified by a voltage drop resulting in the event of a high load current between the source regions and the source connection. Thus, the load current of the integrated power transistor circuit can be detected very precisely and without any losses of active chip area.

Figure 3A:
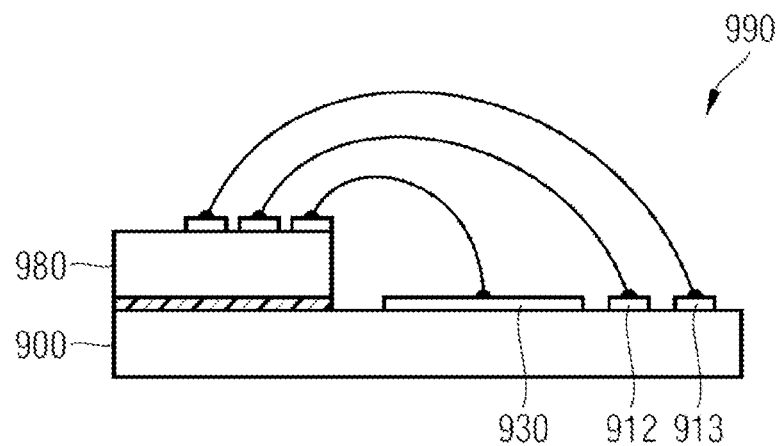
FIG. 3A shows a schematic side view of an arrangement with the integrated power transistor circuit shown in FIG. 1 in accordance with a further embodiment of the invention.

FIG. 3A relates to an embodiment in which the potentials at the selected source regions (tapping contacts) and at the sense transistor cell outside the integrated power transistor circuit are evaluated. The integrated power transistor circuit 300 is accordingly part of an arrangement 990 with integrated circuit units. The arrangement 990 comprises, in addition to the integrated power transistor circuit 900, an integrated sense circuit 980 with a sense circuit unit for determining and controlling the load current. The integrated sense circuit 980 and the integrated power transistor circuit 900 can be arranged on a common carrier or can be provided in different housings. In accordance with the embodiment shown in FIG. 3A, the semiconductor elements of the two integrated circuit units 980, 900 can be fixedly connected to one another. For example, the integrated power transistor circuit 900 comprises a tapping connection 913, which is electrically connected to the second subsection 322 of the contact structure 300 (of the tapping line), and a sense-source connection 912, which is connected to a sense transistor cell of the integrated power transistor circuit 900. The integrated sense circuit is electrically connected to the tapping and sense connections 913, 912 via bonding wires, for example. The evaluation and control function in the sense circuit unit in the integrated sense circuit 980 detects an overload condition for the transistor cells based on signals, which are transmitted from the integrated power transistor circuit 900 via the tapping and sense connections 913, 912.

Figure 3B:
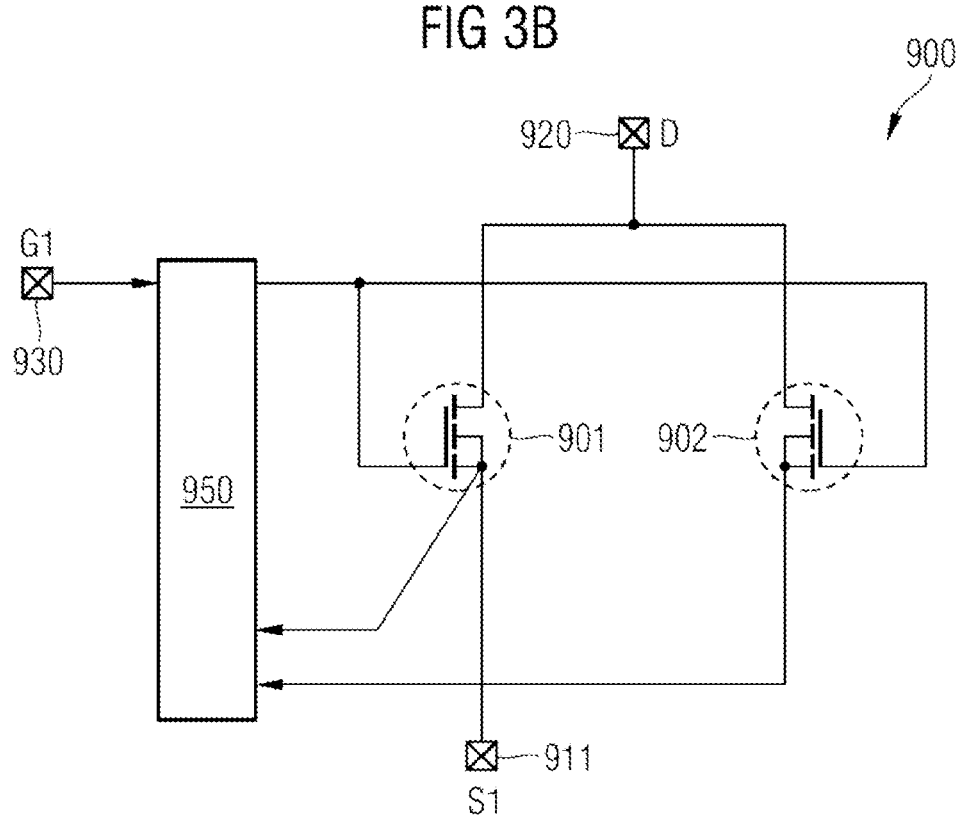
FIG. 3B shows a simplified block circuit diagram of an integrated power transistor circuit in accordance with a further embodiment with an integrated sense circuit unit.

FIG. 3B relates to an embodiment in which a sense circuit unit 950 with an evaluation and control function, together with the power transistor 901 and the sense transistor 902, are implemented on the same semiconductor substrate.

Figure 3C:
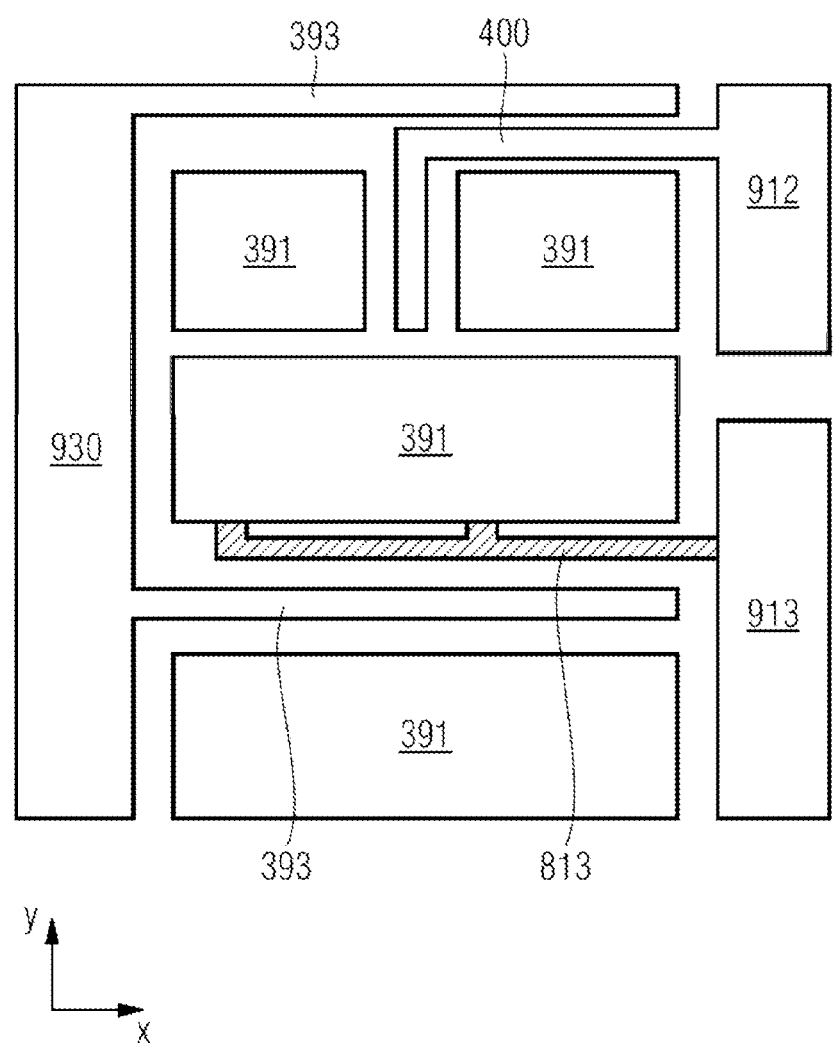
FIG. 3C shows a schematic plan view of a metallization plane of an integrated power transistor circuit with a sense transistor cell.

FIG. 3C shows a very schematized plan view of an integrated power transistor circuit. Cell arrays with transistor cells are arranged in a semiconductor substrate beneath source electrodes 391. The transistor cells are formed along trenches, which extend along the y direction in the semiconductor substrate. As an extension of the trenches outside the cell arrays, gate electrodes 393 make contact with gate conductor structures, which are arranged in the trenches. A transistor cell in the central region of the integrated power transistor circuit is used as sense transistor cell and connected. The source potential of the sense transistor cell is routed to a sense source connection 912, isolated from the source electrodes 391, via a sense line 400. The gate electrodes 393 can be routed to a gate connection 930, for example. The source regions of one or more power transistor cells are routed to a tapping connection 913 via a tapping line 813. Since the tapping line 813 comes from a thin contact layer, only small distances between the tapping line 813 and the source electrode 391 or the gate electrode 393 are necessary.

Figure 4A:
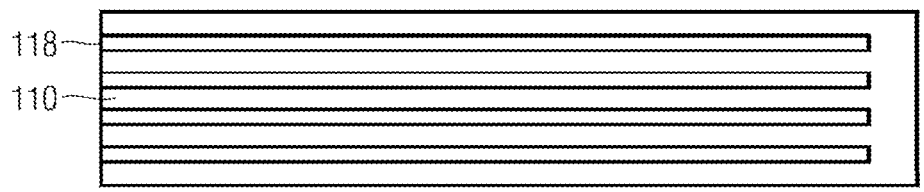
FIG. 4A shows a schematic plan view of a section of an integrated power transistor circuit after the formation of transistor cells, based on a method for producing an integrated power transistor circuit in accordance with a further embodiment.
Figure 4B:
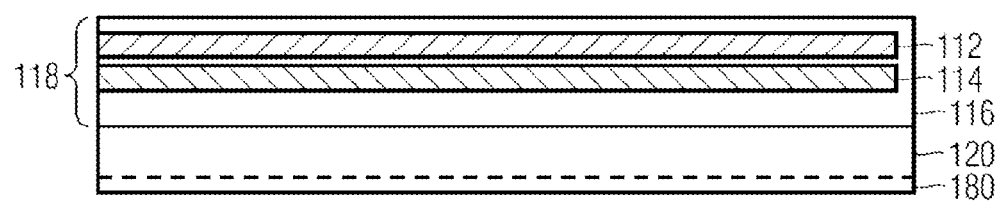
FIG. 4B shows a schematic cross section through the section shown in FIG. 4A along gate trenches.
Figure 4C:
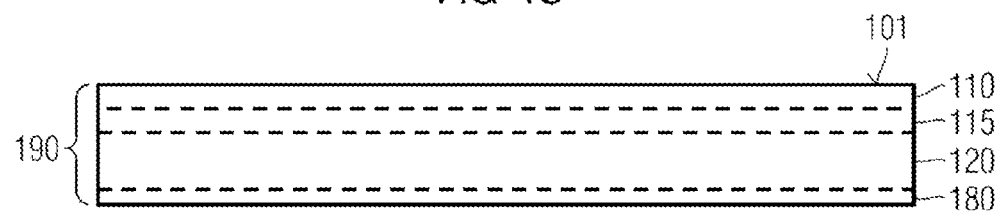
FIG. 4C shows a schematic cross section through the section shown in FIG. 4A along emitter regions.

Corresponding to FIGS. 4A, 4B and 4C, initially transistor cells are formed along trenches 118 in a semiconductor substrate 190. For this purpose, doped regions 110 are formed adjacent to a first surface 101 in the semiconductor substrate 190. The doped regions 110 can be effective as source regions in the finished power transistor circuit. A further doped region 180 is formed on the second side of the semiconductor substrate 190 which is opposite the first side, which further doped region can be effective as drain region in the finished integrated power transistor circuit. A drift zone 120 can adjoin the further doped region 118. The doped regions 110 are formed at least in the region of a cell array or can extend beyond the cell array. Channel regions 115 are formed between the doped regions 110 and the drift zone 120, at least in the region of the cell array, with the conductivity type of said channel regions being opposite that of the doped regions 110. The gate trenches 118 are formed parallel to one another and at regular distances from one another. Gate conductor structures 112 are formed at the level of the channel regions 115 in the gate trenches 118. In each case one field electrode 114 can be provided in the gate trenches 118 beneath the gate conductor structures 112 in relation to the first surface 101. A dielectric structure 116 insulates the gate conductor structures 112, the field electrodes 114 and the semiconductor substrate 190 electrically from one another.

Figure 5A:
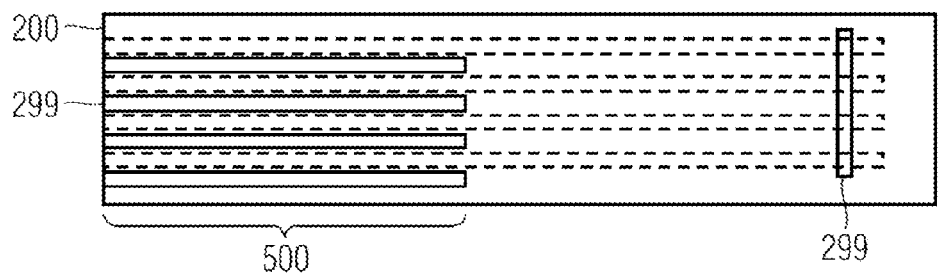
FIG. 5A shows the section of the integrated power transistor circuit shown in FIG. 4A after the formation of openings in a dielectric layer deposited over the transistor cells.
Figure 5B:
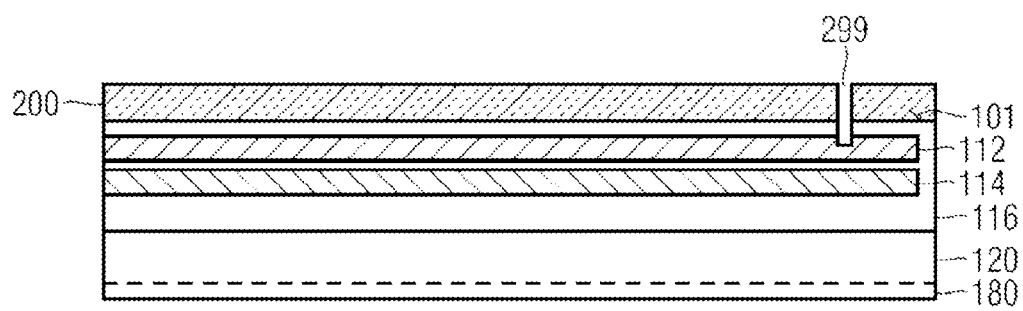
FIG. 5B shows a schematic cross section through the section shown in FIG. 5A along gate trenches.
Figure 5C:
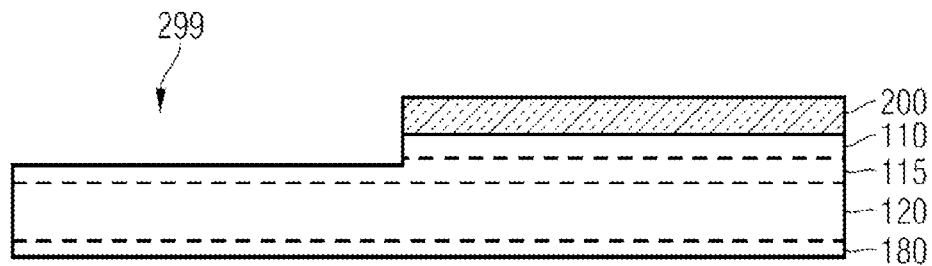
FIG. 5C shows a schematic cross section through the section shown in FIG. 5A along emitter regions.

Corresponding to FIGS. 5A, 5B, 5C, a dielectric layer 200 is provided on the first surface 101, for example by deposition of silicon oxide or BPSG. Openings 299 are introduced into the dielectric layer 200, the openings 299 exposing the doped regions 110 and the channel region 115 in the cell array 500 and the gate conductor structures 112 outside the cell array 500. FIG. 5B shows the exposed gate conductor structures 112 and FIG. 5C shows the exposed doped regions 110 and the exposed channel region 115. In accordance with the embodiments shown, the openings 299 extend into the gate conductor structures 112 or at least as far as an upper edge of the channel region 115 or into the channel region 115. A contact layer is deposited onto the dielectric layer 200. The contact layer fills the openings 299, and is then photolithographically structured.

Figure 6A:
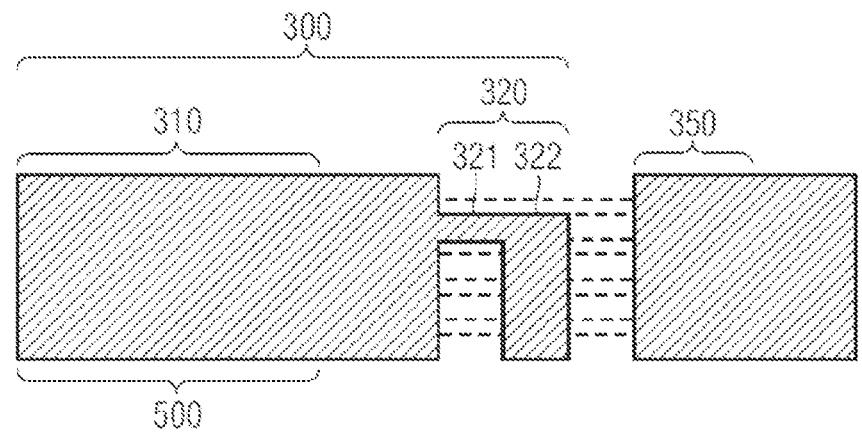
FIG. 6A shows the section of the integrated power transistor circuit shown in FIG. 5A after deposition of a contact layer and structuring of the contact layer to form a contact structure.
Figure 6B:
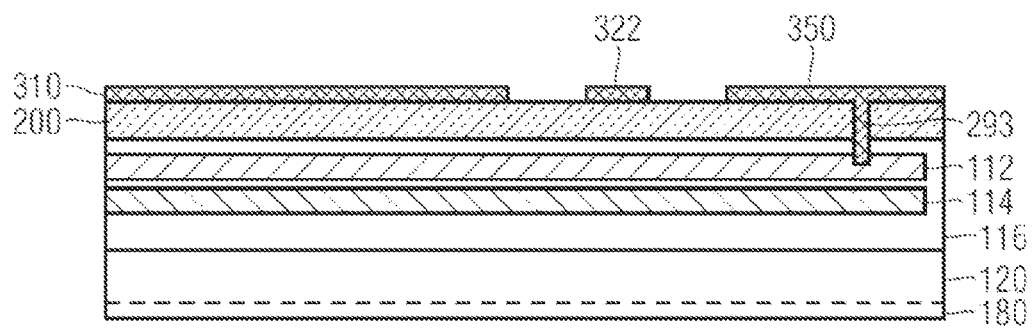
FIG. 6B shows a schematic cross section through the section shown in FIG. 6A along gate trenches.
Figure 6C:
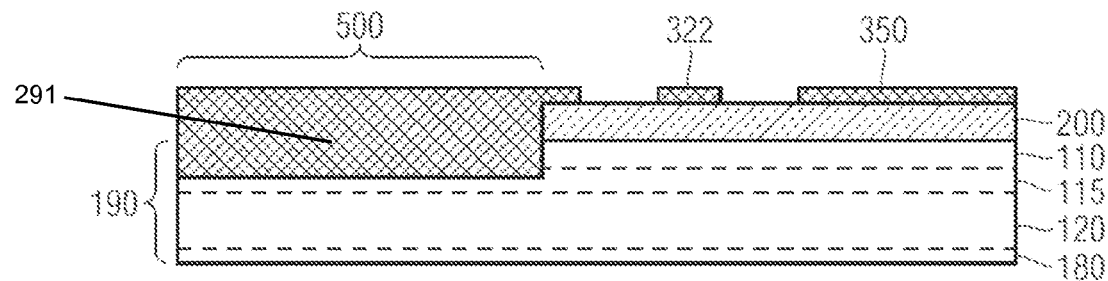
FIG. 6C shows a schematic cross section through the section shown in FIG. 6A along emitter regions.

As shown in FIGS. 6A, 6B, 6C, the material of the deposited contact layer fills the openings 299 and forms first plated-through holes 293 with respect to the gate conductor structures 112 and second plated-through holes 291 with respect to the doped regions 110 and the channel region 115. The deposition of the contact layer in accordance with one embodiment comprises the deposition of a tungsten layer. In accordance with other embodiments, the deposition of the contact layer additionally comprises the deposition of barrier and auxiliary layers prior to the deposition of a tungsten layer. The barrier and auxiliary layers can contain or consist of titanium and titanium nitride, for example.

The contact structure 300 proceeding from the contact layer has a first section 310 in the cell array 500. A second section 320 comprises one or more first subsections 321, which extend beyond the cell array 500 in the direction predetermined by the longitudinal direction of the gate trenches 118 for selected transistor cells, and a second subsection 322, which adjoins the first subsection(s) 321 directly and extends in a direction which intersects the longitudinal direction of the gate trenches 118, for example at a right angle. In addition to this, the contact structure 300 can have further sections 350, which are electrically insulated and physically separated from the first and second sections 310, 320, for example in the region of gate electrodes and other metallizations. Likewise, the contact structure 300 can have further sections between the first section 310 and the second section 320.

Since the contact layer is comparatively thin, the tapping line formed by the second subsection 322 of the contact structure 300 can be implemented at a small distance from other sections, for example from the first section 310 and the further sections 350. The distances can be a few 10 nanometers, for example. In accordance with one embodiment, the distance between the tapping line and the first section 310, or between the tapping line and the further section 350, is at most 100 nanometers. Then, a comparatively thick metallization is applied to the contact structure 300 and structured. The metallization consists of an aluminum-copper alloy, for example. The thickness of the metallization is at least one micrometer, ten micrometers or more. The high layer thickness of the metallization requires a wide distance between adjacent electrode structures which are electrically insulated from one another, such as the source electrode 391 and the gate electrode 393, for example, for etching purposes.

FIGS. 7A, 7B, 7C show the source electrodes 391 and gate electrodes 393 and drain electrodes 392 coming from the thick metallization layer on that side of the semiconductor substrate 190 which is opposite the first side. In accordance with the embodiment illustrated, the two plated-through holes 291 each extend over their entire length through the dielectric layer 200 and the doped regions 110, with the result that electrical contact is made with the doped regions 110 on the side walls and with the channel region 115 at the bottom of the second plated-through holes 291. In accordance with another embodiment, the second plated-through holes 291 make contact with the doped regions 110 and the channel region 115 alternately, wherein the second plated-through holes 291 can rest sectionally as flat contact on the doped regions 110.

FIG. 8 shows, schematically, a method for producing an integrated power transistor circuit in accordance with one embodiment. Transistor cells are formed in a semiconductor substrate, each transistor cell having a doped region on a first side of the semiconductor substrate adjoining a first surface of the semiconductor substrate (802). A contact layer is deposited over the first side of the semiconductor substrate (804). The contact layer is structured to form a contact structure (806). The contact structure has a first section in the cell array and a second section outside the cell array, which second section connects the first section to an interface structure. An electrode structure is formed on and in direct contact with the first section, said electrode structure being absent over the second section (808).

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An integrated power transistor circuit, comprising:
a cell array;
a region outside the cell array;
a plurality of transistor cells arranged in the cell array and connected in parallel to form a power transistor, each of the transistor cells having a doped region formed in a semiconductor substrate and adjoining a first surface on a first side of the semiconductor substrate, a channel region and a gate conductor structure;
an electrode structure formed on the first side of the semiconductor substrate in a projection of the cell array orthogonal to the first surface;
a contact structure on the first side of the semiconductor substrate and electrically conductively connected to the doped region and the electrode structure, the contact structure having a first section between the electrode structure and the semiconductor substrate above the cell array and a second section above the region outside the cell array, the second section connecting the first section to an interface structure in the region outside the cell array;
a gate electrode arranged on the first side of the semiconductor substrate outside the cell array, the gate electrode being physically separated from and electrically connected to the gate conductor structures;
a dielectric layer between the first surface and the contact structure, the dielectric layer disposed in both the cell array and the region outside the cell array; and
plated-through holes in the cell array, each plated-through hole extending through the dielectric layer and electrically connecting the contact structure to the doped region and the channel region of each transistor cell of the power transistor,
wherein the contact structure has a further section arranged on the first side of the semiconductor substrate outside the cell array and between the gate electrode and the semiconductor substrate, the further section being electrically insulated and physically separated from the first and the second sections of the contact structure,
wherein each gate conductor structure extends in a longitudinal direction from the corresponding cell array into the region outside the cell array and under the gate electrode.

2. The integrated power transistor circuit of claim 1, further comprising:
a further doped region on a second side opposite the first side of the semiconductor substrate, wherein the doped region and the further doped region have the same conductivity type and a current flow between the doped region and the further doped region is controllable by a potential applied to the gate conductor structures.

3. The integrated power transistor circuit of claim 1, further comprising:
plated-through holes outside the cell array, each plated-through hole extending through the dielectric layer and electrically connecting the gate electrode to one of the gate conductor structures,
wherein the plated-through holes and at least one partial layer of the contact structure directly adjoining the dielectric layer are formed from the same material or the same materials.

4. The integrated power transistor circuit of claim 1, wherein the gate conductor structures are provided in gate trenches which extend, starting from the first surface, into the semiconductor substrate.

5. The integrated power transistor circuit of claim 1, wherein a thickness of the contact structure is at most 300 nanometers and a thickness of the electrode structure is at least one micrometer.

6. The integrated power transistor circuit of claim 1, wherein each gate conductor structure extends in the longitudinal direction beyond the gate electrode.

7. The integrated power transistor circuit of claim 1, wherein the doped region comprises a strip extending along the longitudinal direction, and wherein the second section of the contact structure has one or more first subsections, which each extend, starting from the first section, in the longitudinal direction, and a second subsection, which adjoins the one or more first subsections and extends along a different direction, which intersects the first direction.

8. The integrated power transistor circuit of claim 7, wherein the second subsection of the contact structure is a strip extending parallel to a straight edge of the electrode structure.

9. The integrated power transistor circuit of claim 7, wherein the second subsection of the contact structure is a strip extending parallel to a straight edge of the gate electrode.

10. The integrated power transistor circuit of claim 7, further comprising a tapping connection electrically connected to the second subsection of the contact structure.

11. The integrated power transistor circuit of claim 10, further comprising:
- a sense line on the first side of the semiconductor substrate and electrically connected to at least one doped region not connected to the electrode structure; and
- a sense-source connection electrically connected to the sense line.

12. An arrangement with integrated circuit units comprising the integrated power transistor circuit of claim 11, the arrangement further comprising:
- an integrated sense circuit having a sense circuit unit connected to the tapping and sense-source connections of the integrated power transistor circuit, the sense circuit unit operable to detect an overload condition of the transistor cells based on signals transmitted from the integrated power transistor circuit via the tapping and sense-source connections.

13. The integrated power transistor circuit of claim 7, further comprising a sense circuit unit electrically connected to the second subsection of the contact structure, wherein the sense circuit unit is operable to detect an overload condition of the transistor cells based on a signal tapped off and transmitted by the second section of the contact structure.

14. The integrated power transistor circuit of claim 13, further comprising a sense line on the first side of the semiconductor substrate and electrically connected to at least one doped region not connected to the electrode structure, and wherein the sense circuit unit is further operable to detect the overload condition based on a signal tapped off and transmitted by the sense line.

* * * * *